United States Patent
Oh

(10) Patent No.: US 11,480,622 B2
(45) Date of Patent: Oct. 25, 2022

(54) APPARATUS AND METHOD FOR DIAGNOSING BATTERY REPLACEMENT FOR VEHICLES

(71) Applicants: HYUNDAI MOTOR COMPANY, Seoul (KR); KIA MOTORS CORPORATION, Seoul (KR)

(72) Inventor: Hong Min Oh, Yongin-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 323 days.

(21) Appl. No.: 16/849,454

(22) Filed: Apr. 15, 2020

(65) Prior Publication Data

US 2021/0181261 A1 Jun. 17, 2021

(30) Foreign Application Priority Data

Dec. 17, 2019 (KR) .................. 10-2019-0168862

(51) Int. Cl.
*G01R 31/389* (2019.01)
*H01M 10/48* (2006.01)
*B60L 53/80* (2019.01)
*G01R 31/392* (2019.01)

(52) U.S. Cl.
CPC ............ *G01R 31/389* (2019.01); *B60L 53/80* (2019.02); *G01R 31/392* (2019.01); *H01M 10/48* (2013.01); *H01M 2220/20* (2013.01)

(58) Field of Classification Search
CPC .... G01R 31/364; G01R 1/203; G01R 27/205; G01R 31/006; H01M 2/30; H01M 10/48; H01M 10/425; H01M 2010/4271; B60L 50/60; B60L 3/0069; B60L 3/12; H01H 47/002
USPC ............. 324/415, 437, 425–435, 76.11, 126, 324/756.05, 538, 200, 207.13, 233, 256, 324/515, 500–530, 750.06
See application file for complete search history.

(56) References Cited

U.S. PATENT DOCUMENTS

| | | | |
|---|---|---|---|
| 2013/0138373 A1* | 5/2013 | Lee ..................... | G16Z 99/00 702/65 |
| 2020/0217901 A1* | 7/2020 | Sugiyama ........... | H02J 7/00036 |

* cited by examiner

*Primary Examiner* — Patrick Assouad
*Assistant Examiner* — Trung Q Nguyen
(74) *Attorney, Agent, or Firm* — Lempia Summerfield Katz LLC

(57) ABSTRACT

An apparatus and a method for diagnosing battery replacement for vehicles may accurately diagnose whether a battery has been replaced using an internal resistance of the battery. The apparatus includes a measurer for measuring the internal resistance of the battery, a storage for storing the measured internal resistance, and a controller for diagnosing whether the battery has been replaced based on the internal resistance. The controller, when vehicle power is reset, controls the measurer to measure a first or second internal resistance after starting a vehicle, updates and stores the measured first or second internal resistance in the storage, compares a current first internal resistance value with a former first internal resistance value or a current second internal resistance value with a former second internal resistance value, and diagnoses that the battery has been replaced when the corresponding values differ from each other.

18 Claims, 4 Drawing Sheets

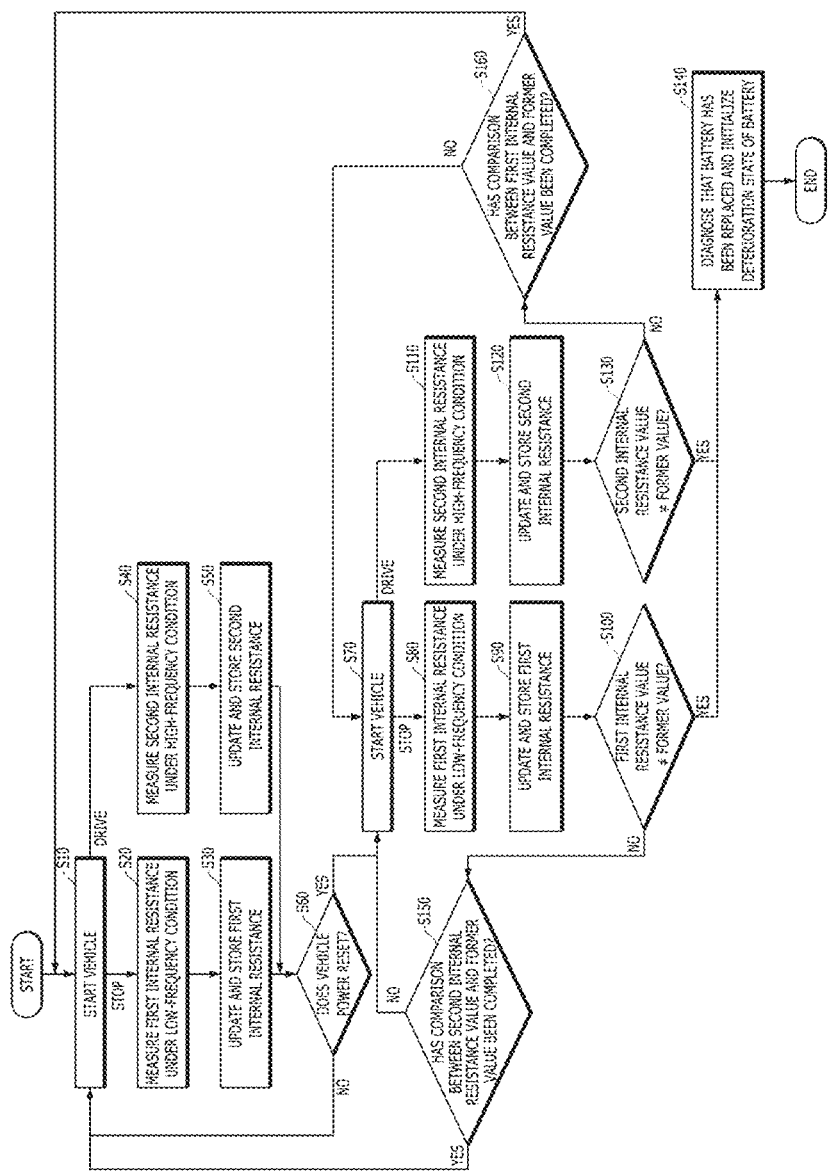

APPARATUS AND METHOD FOR DIAGNOSING BATTERY REPLACEMENT FOR VEHICLES

This application claims the benefit of and priority to Korean Patent Application No. 10-2019-0168862, filed on Dec. 17, 2019, which is hereby incorporated by reference as if fully set forth herein.

BACKGROUND OF THE INVENTION

Field of the Invention

The present disclosure relates to an apparatus and method for diagnosing battery replacement for vehicles, and more particularly, to an apparatus and method for diagnosing battery replacement for vehicles which may accurately diagnose whether a battery has been replaced using the internal resistance of the battery.

Discussion of the Related Art

In general, a conventional vehicle battery employs a system, which is used only when the engine of a vehicle is started and is consistently charged during driving of the vehicle in order to maintain the fully charged state of the battery.

Recently, as systems for improving fuel efficiency have been applied, logic to diagnose the state (temperature, SOC, lifespan, etc.) of a vehicle battery has been implemented.

However, if the battery has been replaced, the fuel efficiency improvement system cannot accurately diagnose the battery state and thus may provide inaccurate analysis results. Thus, the system is liable to accelerate deterioration of the battery due to the inaccurate analysis results and make it difficult to sufficiently use available energy of a new battery.

However, in a conventional method for diagnosing whether a battery has been replaced, if the battery has been replaced, it is difficult to accurately diagnose whether a new battery is of the same type as the former battery or has the same capacity as the former battery.

SUMMARY OF THE INVENTION

Therefore, it is required to develop an apparatus for diagnosing battery replacement for vehicles. The apparatus may accurately diagnose whether a battery has been replaced and accurately estimate the state of a new battery so as to increase the lifespan of the battery and maximally use the energy of the battery.

Accordingly, the present disclosure is directed to an apparatus and method for diagnosing battery replacement for vehicles that, substantially obviate one or more problems due to limitations and disadvantages of the related art.

An object of the present disclosure is to provide an apparatus and method for diagnosing battery replacement for vehicles which may accurately diagnose whether a battery has been replaced based on a first internal resistance under a low-frequency condition and a second internal resistance under a high-frequency condition and accurately estimate the state of a new battery. Thus, the lifespan of the battery may be increased and battery energy may be maximally used.

Additional advantages, objects, and features of the present disclosure are set forth in part in the following description and in part should become apparent to those having ordinary skill in the art upon examination of the following description or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, an apparatus for diagnosing battery replacement for a vehicle includes a measurer configured to measure an internal resistance of a battery, a storage configured to store the measured internal resistance, and a controller configured to diagnose whether the battery has been replaced based on the internal resistance. The controller, when vehicle power is reset: controls the measurer to measure a first internal resistance or a second internal resistance after starting the vehicle; updates the measured first or second internal resistance and stores the updated first or second internal resistance in the storage; compares a current first internal resistance value with a former first internal resistance value or compares a current second internal resistance value with a former second internal resistance value; and diagnoses that the battery has been replaced when the corresponding values differ from each other.

In another aspect of the present disclosure, a method for diagnosing battery replacement in an apparatus for diagnosing battery replacement for a vehicle includes confirming whether the vehicle is started, measuring a first internal resistance or a second internal resistance when the vehicle is started, updating the measured first or second internal resistance, and storing the updated first or second internal resistance. The method further includes confirming whether vehicle power is reset and confirming whether the vehicle is started when the vehicle power is reset. The method further includes re-measuring the first internal resistance or the second internal resistance when the vehicle is started and re-updating the re-measured first or second internal resistance and storing the re-updated first or second internal resistance. The method also includes comparing a current first internal resistance value with a former first internal resistance value or comparing a current second internal resistance value with a former second internal resistance value, and diagnosing that the battery has been replaced, as a result of the comparison, when the corresponding values differ from each other. Each of these steps may be performed via different unique processors, the same processor, or two or more processors.

In yet another aspect of the present disclosure, a computer readable recording medium, on which a program for executing the method for diagnosing battery replacement for a vehicle is recorded, executes a process provided by the method for diagnosing battery replacement.

In still yet another aspect of the present disclosure, a vehicle includes a battery, and an apparatus for diagnosing battery replacement. The apparatus is configured to diagnose whether the battery has been replaced based on an internal resistance of the battery. The apparatus includes a measurer configured to measure the internal resistance of the battery, a storage configured to store the measured internal resistance, and a controller. The controller is configured, when vehicle power is reset: to control the measurer to measure a first internal resistance or a second internal resistance after starting the vehicle; to update the measured first or second internal resistance and to store the updated first or second internal resistance in the storage; to compare a current first internal resistance value with a former first internal resistance value or to compare a current second internal resistance value with a former second internal resistance value; and to diagnose that the battery has been replaced when the corresponding values differ from each other.

It should be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings provide a further understanding of the present disclosure and are incorporated herein to constitute a part of this application. The drawings illustrate embodiment s) of the present disclosure and together with the description serve to explain the principle of the present disclosure. In the drawings:

FIG. 10 is a flowchart illustrating a method for diagnosing battery replacement in an apparatus for diagnosing battery replacement according to one embodiment of the present disclosure.

DETAILED DESCRIPTION OF THE INVENTION

Figure 1:
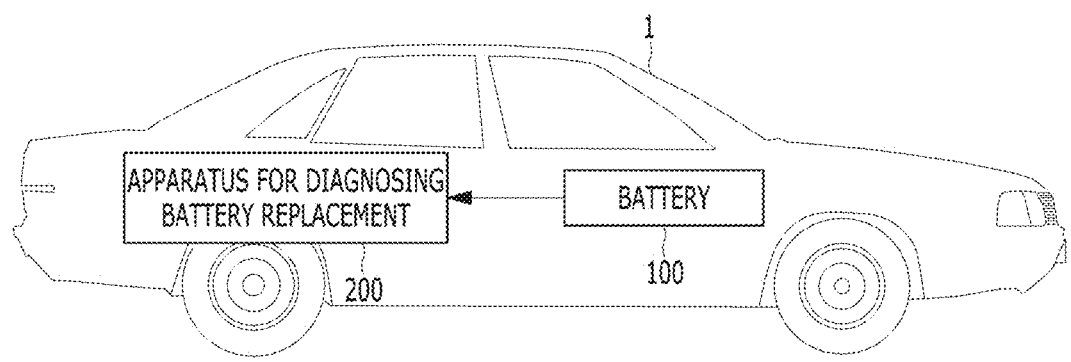
FIG. 1 is a view illustrating a vehicle to which an apparatus for diagnosing battery replacement according to one embodiment of the present disclosure is applied.

Reference is made in detail to the preferred embodiments of the present disclosure, examples of which are illustrated in the accompanying drawings. However, the present disclosure is not limited to the embodiments set forth herein and may be variously modified. In the drawings, in order to clearly describe the present disclosure, descriptions of elements which are not related to the present disclosure have been omitted, and the same or similar elements are denoted by the same reference numerals even when they are depicted in different drawings.

In the following description of the embodiments, it should be understood that, when a part "includes" an element, the part may further include other elements and does not exclude presence of such other elements, unless stated otherwise. Further, in the following description of the embodiments, it should be understood that suffixes "part", "unit" and "module" indicate a unit for a specific purpose or for processing at least one function, operation, or the like, which may be implemented using hardware, software, or a combination of hardware and software. Such a unit may be said to be configured to meet that particular purpose or to process the at least one function, operation, or the like. Further, the controller described herein may include a processor programmed to perform the noted process, function, operation, and the like.

Hereinafter, with reference to FIGS. 1-10, an apparatus and a method for diagnosing battery replacement for vehicles, to which the embodiments of the present disclosure are applicable, are described in detail.

FIG. 1 is a view illustrating a vehicle to which an apparatus for diagnosing battery replacement according to one embodiment of the present disclosure is applied.

As shown in FIG. 1, a vehicle 1 may include a battery 100 and an apparatus 200 for diagnosing battery replacement. The apparatus 200 diagnoses whether the battery 100 has been replaced based on the internal resistance of the battery 100.

The apparatus 200 for diagnosing battery replacement may measure a first internal resistance or a second internal resistance after starting the vehicle 1 prior to resetting vehicle power. When the first or second internal resistance is measured, the apparatus 200 may update the first or second internal resistance and store the updated first or second internal resistance.

In one embodiment, the first internal resistance may be the internal resistance of the battery 100 when low-frequency power is applied to the battery 100. The second internal resistance may be the internal resistance of the battery 100 when high-frequency power applied to the battery 100.

In another embodiment, the first internal resistance may be the internal resistance of the battery 100 when the rotational speed of an engine of the vehicle 1 is increased and the vehicle 1 is in a stopped state. The second internal resistance may be the internal resistance of the battery 100 when the rotational speed of the engine of the vehicle 1 is increased and the vehicle 1 is in a driving state.

Further, the apparatus 200 for diagnosing battery replacement may confirm whether the vehicle power is reset and measure the first internal resistance or the second internal resistance after starting the vehicle 1 when the apparatus 200 confirms that the vehicle power is reset. The apparatus 200 may update the measured first or second internal resistance and store the updated first or second internal resistance. The apparatus 200 may compare a current first internal resistance value with a former first internal resistance value or compare a current second internal resistance value with a former second internal resistance value. The apparatus 200 may diagnose that the battery 100 has been replaced when the corresponding internal resistance value differs from the former internal resistance value.

In this embodiment, the apparatus 200 for diagnosing battery replacement may confirm whether the current first internal resistance value differs from the former first internal resistance value. The apparatus 200 may diagnose that the battery 100 has been replaced when the current first internal resistance value differs from the former first internal resistance value.

In the confirmation as to whether the current first internal resistance value differs from the former first internal resistance value, the apparatus 200 for diagnosing battery replacement may perform the following steps. When the current first internal resistance value is the same as the former first internal resistance value, the apparatus 200 for diagnosing battery replacement may confirm whether the comparison between the current second internal resistance value and the former second internal resistance value has been completed. The apparatus 200 may measure the internal resistance prior to resetting the vehicle power when the comparison between the current second internal resistance value and the former second internal resistance value has been completed.

In this embodiment, the apparatus 200 for diagnosing battery replacement may measure the internal resistance after resetting the vehicle power when the comparison between the current second internal resistance value and the former second internal resistance value has not been completed.

Further, the apparatus 200 for diagnosing battery replacement may confirm whether the current second internal resistance value differs from the former second internal resistance value. The apparatus 200 may diagnose that the battery 100 has been replaced when the current second internal resistance value differs from the former second internal resistance value.

In the confirmation as to whether the current second internal resistance value differs from the former second internal resistance value, the apparatus 200 for diagnosing battery replacement may perform the following steps. When the current second internal resistance value is the same as the former second internal resistance value, the apparatus 200 for diagnosing battery replacement may confirm whether the comparison between the current first internal resistance value and the former first internal resistance value has been completed. The apparatus 200 may measure the internal resistance prior to resetting the vehicle power when the comparison between the current first internal resistance value and the former first internal resistance value has been completed.

In this embodiment, the apparatus 200 for diagnosing battery replacement may measure the internal resistance after resetting the vehicle power when the comparison between the current first internal resistance value and the former first internal resistance value has not been completed.

Figure 2:
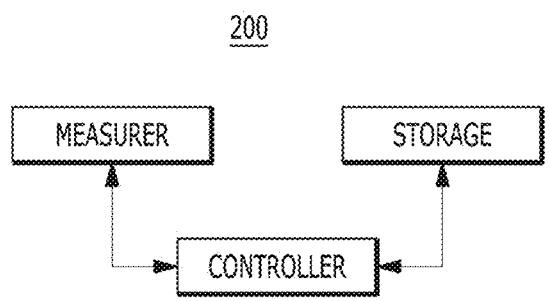
FIG. 2 is a block diagram illustrating the apparatus for diagnosing battery replacement according to one embodiment of the present disclosure.

FIG. 2 is a block diagram illustrating the apparatus for diagnosing battery replacement according to one embodiment of the present disclosure.

As shown in FIG. 2, the apparatus 200 for diagnosing battery replacement 200 according to the present disclosure may include a measurer which measures the internal resistance of the battery, storage which stores the measured internal resistance, and a controller which diagnoses whether the battery has been replaced based on the internal resistance thereof.

In this embodiment, the measurer may measure different battery resistances depending on the frequency of power applied to the battery.

In one embodiment, when the frequency of the power applied to the battery is a low frequency, the measurer may measure internal resistance of the battery corresponding to the low frequency. When the frequency of the power applied to the battery is a high frequency, the measurer may measure internal resistance of the battery corresponding to the high frequency.

Further, the controller may control the measurer to measure a first internal resistance or a second internal resistance after starting the vehicle, update the measured first or second internal resistance, and store the updated first or second internal resistance in the storage.

In this embodiment, the first internal resistance may be the internal resistance of the battery when low-frequency power is applied to the battery. The second internal resistance may be the internal resistance of the battery when high-frequency power is applied to the battery.

As circumstances require, the first internal resistance may be the internal resistance of the battery when the rotational speed of the engine of the vehicle is increased and the vehicle is in the stopped state. The second internal resistance may be the internal resistance of the battery when the rotational speed of the engine of the vehicle is increased and the vehicle is in the driving state.

In the update and storage of the measured first or second internal resistance, when the first internal resistance is measured, the controller may update the measured first internal resistance and store the updated first internal resistance.

In another embodiment, in the update and storage of the measured first or second internal resistance, when the second internal resistance is measured, the controller may update the measured second internal resistance and store the updated second internal resistance.

Thereafter, the controller may confirm whether vehicle power is reset and may control the measurer to measure the first internal resistance or the second internal resistance after starting the vehicle when the controller confirms that the vehicle power is reset. The controller may update the measured first or second internal resistance and store the updated first or second internal resistance in the storage. The controller may compare a current first internal resistance value with a former first internal resistance value or compare a current second internal resistance value with a former second internal resistance value. The controller may diagnose that the battery has been replaced when the corresponding internal resistance value differs from the former internal resistance value.

In this embodiment, in the measurement of the first internal resistance, the controller may control the measurer to measure the internal resistance of the battery when the low-frequency power is applied to the battery.

As circumstances require, in the measurement of the first internal resistance, the controller may control the measurer to measure the internal resistance of the battery when the rotational speed of the engine of the vehicle is increased and the vehicle is in the stopped state.

In another embodiment, in the measurement of the second internal resistance, the controller may control the measurer to measure the internal resistance of the battery when the high-frequency power is applied to the battery.

As circumstances require, in the measurement of the second internal resistance, the controller may control the measurer to measure the internal resistance of the battery when the rotational speed of the engine of the vehicle is increased and the vehicle is in the driving state.

Further, in the update and storage of the measured first or second internal resistance, when the first internal resistance is measured, the controller may update the measured first internal resistance and store the updated first internal resistance in the storage.

In another embodiment, in the update and storage of the measured first or second internal resistance, when the second internal resistance is measured, the controller may update the measured second internal resistance and store the updated second internal resistance in the storage.

Thereafter, in the comparison between the current first internal resistance value and the former first internal resistance value, the controller may confirm whether the current first internal resistance value differs from the former first internal resistance value. The controller may diagnose that the battery has been replaced when the current first internal resistance value differs from the former first internal resistance value.

In this embodiment, in the confirmation as to whether the current first internal resistance value differs from the former first internal resistance value, the controller may perform the following steps. When the current first internal resistance value is the same as the former first internal resistance value, the controller may confirm whether the comparison between the current second internal resistance value and the former second internal resistance value has been completed. The controller may measure the internal resistance prior to resetting the vehicle power when the comparison between the current second internal resistance value and the former second internal resistance value has been completed.

On the other hand, in the confirmation as to whether the comparison between the current second internal resistance value and the former second internal resistance value has been completed, when the comparison between the current second internal resistance value and the former second internal resistance value has not been completed, the controller may measure the internal resistance after resetting the vehicle power.

Further, in the comparison between the current second internal resistance value and the former second internal resistance value, the controller may confirm whether the current second internal resistance value differs from the former second internal resistance value. The controller may diagnose that the battery has been replaced when the current second internal resistance value differs from the former second internal resistance value.

In this embodiment, in the confirmation as to whether the current second internal resistance value differs from the former second internal resistance value, the controller may perform the following steps. When the current second internal resistance value is the same as the former second internal resistance value, the controller may confirm whether the comparison between the current first internal resistance value and the former first internal resistance value has been completed. The controller may measure the internal resistance prior to resetting the vehicle power when the comparison between the current first internal resistance value and the former first internal resistance value has been completed.

On the other hand, in the confirmation as to whether the comparison between the current first internal resistance value and the former first internal resistance value has been completed, when the comparison between the current first internal resistance value and the former first internal resistance value has not been completed, the controller may measure the internal resistance after resetting the vehicle power.

Thereafter, in the diagnosis as to whether the battery has been replaced, when the controller diagnoses that the battery has been replaced, the controller may initialize deterioration state information of a new battery.

As such, in the present, disclosure, whether the battery has been replaced may be accurately diagnosed. The state of a new battery may be accurately estimated based on the first internal resistance under the low-frequency condition and the second internal resistance under the high-frequency condition. Thus, the apparatus 200 for diagnosing batter replacement and its controller are capable of increasing the lifespan of the battery and maximally using battery energy.

Further, in the present disclosure, even if the former battery has been replaced with a new battery of a different type or a different capacity, it may be accurately diagnosed that the battery has been replaced with the new battery. Thus, the energy of the new battery may be maximally used due to initialization of battery deterioration state information.

In addition, in the present disclosure, the state of the battery may be more accurately estimated using the internal resistance of the battery under the low-frequency condition and the internal resistance of the battery under the high-frequency condition.

Figure 3:
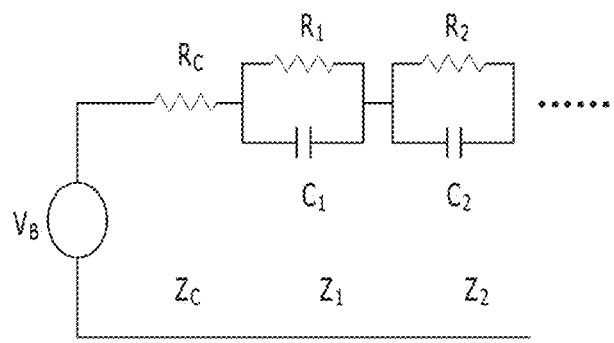
FIGS. 3-5 are views illustrating the internal resistance or a battery depending on frequency characteristics of power applied to the battery.
Figure 4:
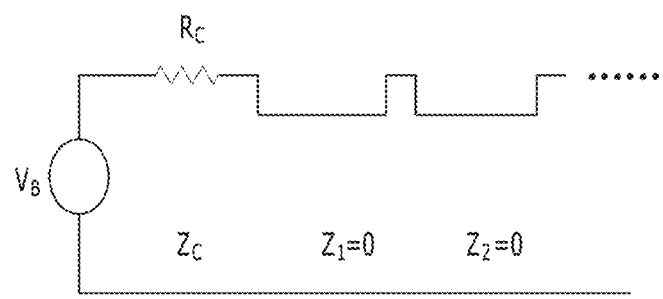
Figure 5:
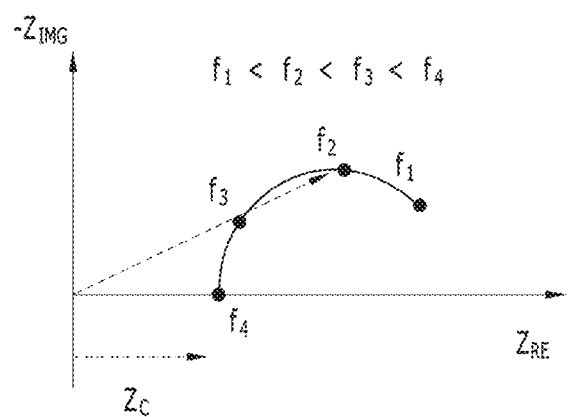

FIGS. 3-5 are views illustrating the internal resistance of the battery depending on frequency characteristics of power applied to the battery.

FIGS. 3 and 4 are circuit diagrams showing battery equivalent circuits. FIG. 5 is a graph showing the internal resistance of the battery depending on power frequency.

As shown in FIG. 3, in the battery equivalent circuit, an internal resistance $Z_B$ may be acquired using the following equation.

$$Z_B = Z_C + Z_1 + Z_2 + \ldots$$

In this embodiment, as the frequency of the power applied to the battery is increased, the value of $Z_1 + Z_2 + \ldots$ may be gradually decreased and converge upon 0.

Therefore, as shown in FIG. 4, since $Z_1 = 0, Z_2 = 0, \ldots$, only the value of $Z_C$ remains.

Thereby, as shown in FIG. 5, it may be confirmed that the internal resistance of the battery varies depending on the frequency of power applied to the battery.

Further, as deterioration of the battery progresses, corrosion of the battery is intensified and thus the internal resistance of the battery is increased.

Figure 6:
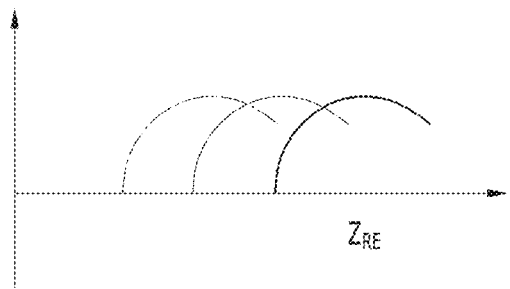
FIGS. 6 and 7 are graphs illustrating the internal resistance of the battery depending on deterioration of the battery.
Figure 7:
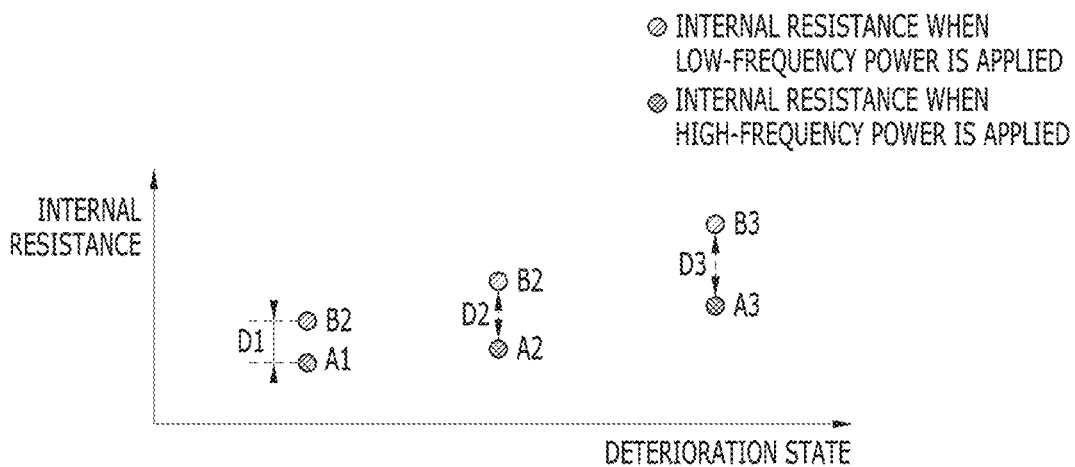

FIGS. 6 and 7 are graphs illustrating the internal resistance of the battery depending on deterioration of the battery.

As shown in FIG. 6, as deterioration of the battery progresses, the internal resistance of the battery may be increased.

Further, as shown in FIG. 7, it may be confirmed that the internal resistance of the battery when high-frequency power is applied to the battery and the internal resistance of the battery when low-frequency power is applied to the battery vary depending on the deterioration state of the battery.

Therefore, the present disclosure may provide a battery replacement diagnosis algorithm using an internal resistance A of the battery corresponding to application of high-frequency power which varies depending on the deterioration state of the battery. The algorithm further uses a difference value D between the internal resistance A of the battery corresponding to application of high-frequency power and an internal resistance B or the battery corresponding to application of low-frequency power.

Further, the present disclosure may use an alternator (or a generator) which is used in vehicles, rather than a separate power supply apparatus.

In this embodiment, the alternator is an apparatus which rectifies alternating current power to direct current, but the alternator does not rectify completely and thus may be provided in the form of a power supply having a predetermined frequency.

The frequency of the alternator may be in proportion to the rotational speed of the engine. As the rotational speed of the engine is increased, the alternator, which is a peripheral component of the engine, is also rotated at an increased speed and thus the frequency of the power supply is increased.

Figure 8:
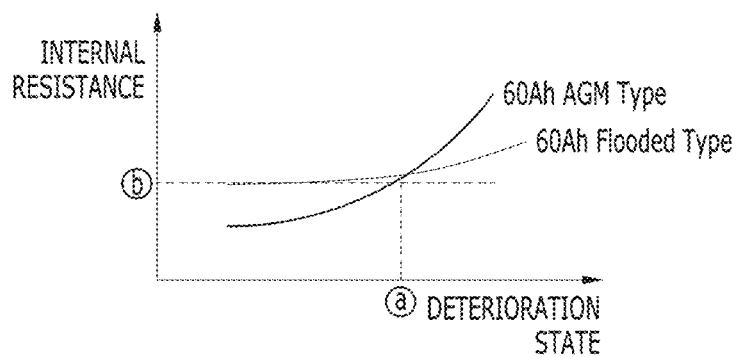
FIGS. 8 and 9 are graphs illustrating diagnosis of replacement with a new battery of a different type and a new battery of a different capacity respectively.
Figure 9:
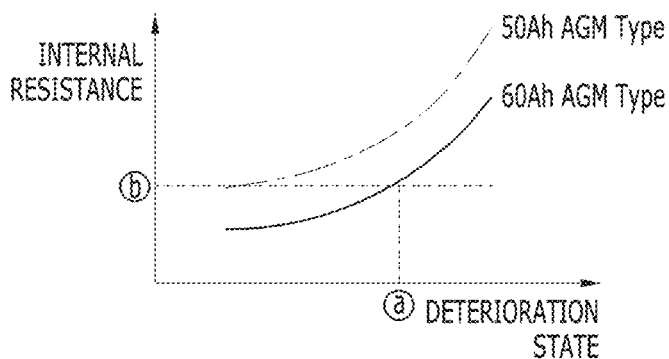

FIGS. 8 and 9 are graphs illustrating diagnosis of replacement with a new battery of a different type and a new battery of a different capacity respectively.

As shown in FIG. 8, if a battery has been replaced with a new battery of a different type and the same capacity, the internal resistance values of a 60 Ah flooded-type battery may be measured and stored until time as follows.

For example, a high-frequency internal resistance may be about 4 mΩ, a low-frequency internal resistance may be about 6 mΩ, and a difference between the high-frequency internal resistance and the low-frequency internal resistance may be about 2 mΩ.

Thereafter, measurement results of the internal resistance values of the battery after resetting power of a vehicle are as follows.

For example, a high-frequency internal resistance may be about 4 mΩ, a low-frequency internal resistance may be about 5 mΩ, and a difference between the high-frequency internal resistance and the low-frequency internal resistance may be about 1 mΩ.

Therefore, in the present disclosure, since the same high-frequency internal resistance is measured but the difference between the high-frequency internal resistance and the low-frequency internal resistance varies, it may be diagnosed that the battery has been replaced with a different battery.

As shown in FIG. 9, if a battery has been replaced with a new battery of a different capacity and the same type, the internal resistance values of a 60 Ah AGM-type battery may be measured and stored until time ⓐ as follows.

For example, a high-frequency internal resistance may be about 3 mΩ, a low-frequency internal resistance may be about 5 mΩ, and a difference between the high-frequency internal resistance and the low-frequency internal resistance may be about 2 mΩ.

Thereafter, measurement results of the internal resistance values of the battery after resetting power of a vehicle are as follows.

For example, a high-frequency internal resistance may be about 3 mΩ, a low-frequency internal resistance may be about 4 mΩ, and a difference between the high-frequency internal resistance and the low-frequency internal resistance may be about 1 mΩ.

Therefore, in the present disclosure, since the same high-frequency internal resistance is measured but the difference between the high-frequency internal resistance and the low-frequency internal resistance varies, it may be diagnosed that the battery has been replaced with a different battery.

FIG. 10 is a flowchart illustrating a method for diagnosing battery replacement in an apparatus for diagnosing battery replacement according to one embodiment of the present disclosure.

As shown in FIG. 10, in the present disclosure, first, whether a vehicle is started may be confirmed (S10), and when it is confirmed that the vehicle is started, a first internal resistance or a second internal resistance may be measured (S20 or S40).

In this embodiment, the first internal resistance may be the internal resistance of a battery when low-frequency power is applied to the battery. The second internal resistance may be the internal resistance of the battery when high-frequency power is applied to the battery.

As circumstances require, the first internal resistance may be the internal resistance of the battery when the rotational speed of an engine of the vehicle is increased and the vehicle is in the stopped state. The second internal resistance may be the internal resistance of the battery when the rotational speed of the engine of the vehicle is increased and the vehicle is in the driving state.

Thereafter, in the present disclosure, the measured first or second internal resistance may be updated and then the updated first or second internal resistance may be stored (S30 or S50).

In this embodiment, in the present disclosure, when the first internal resistance is measured, the measured first internal resistance may be updated and stored. When the second internal resistance is measured, the measured second internal resistance may be updated and stored.

Thereafter, in the present disclosure, whether vehicle power is reset may be confirmed (S60).

Subsequently, when the vehicle power is reset, whether the vehicle is started may be confirmed (S70). When the vehicle is started, the first internal resistance or the second internal resistance may be measured (S80 or S110).

Thereafter, in the present disclosure, the measured first or second internal resistance may be updated and then the updated first or second internal resistance may be stored (S90 or S120).

Subsequently, in the present disclosure, a current first internal resistance value may be compared with a former first internal resistance value (S100), or a current second internal resistance value may be compared with a former second internal resistance value (S130).

Thereafter, in the present disclosure, as a result of the comparison, when the current first internal resistance value differs from the former first internal resistance value, it may be diagnosed that the battery has been replaced (S140).

On the other hand, in the present disclosure, as the result of the comparison, when the current first internal resistance value is the same as the former first internal resistance value, whether the comparison between the current second internal resistance value and the former second internal resistance value has been completed may be confirmed (S150). When the comparison between the current second internal resistance value and the former second internal resistance value has been completed, the internal resistance may be measured prior to resetting the vehicle power. When it is confirmed that the comparison between the current second internal resistance value and the former second internal resistance value has not been completed, the internal resistance may be measured after resetting the vehicle power.

Further, in the present disclosure, as the result of the comparison, when the current second internal resistance value differs from the former second internal resistance value, it may be diagnosed that the battery has been replaced (S140).

On the other hand, in the present disclosure, as the result of the comparison, when the current second internal resistance value is the same as the former second internal resistance value, whether the comparison between the current first internal resistance value and the former first internal resistance value has been completed may be confirmed (S160). When it is confirmed that the comparison between the current first internal resistance value and the former first internal resistance value has been completed, the internal resistance may be measured prior to resetting the vehicle power. When it is confirmed that the comparison between the current first internal resistance value and the former first internal resistance value has not been completed, the internal resistance may be measured after resetting the vehicle power.

Further, in the present disclosure, when it is diagnosed that the battery has been replaced, deterioration state information of the battery may be initialized (S140).

As such, in the present disclosure, whether the battery has been replaced may be accurately diagnosed and the state of a new battery may be accurately estimated based on the first internal resistance under the low-frequency condition and the second internal resistance under the high-frequency condition. Thus, the method for diagnosing battery replacement in an apparatus for diagnosing battery replacement is capable of increasing the lifespan of the battery and maximally using battery energy.

Further, in the present disclosure, even if the battery has been replaced with a new battery of a different type or a different capacity, whether the battery has been replaced may be accurately diagnosed, and the energy of the new battery may be maximally used due to initialization of battery deterioration state information.

Moreover, in the present disclosure, the state of the battery may be more accurately estimated using the internal resistance of the battery under the low-frequency condition and the internal resistance of the battery under the high-frequency condition.

In addition, in the present disclosure, a computer readable recording medium, in which a program for executing the method for diagnosing battery replacement in the apparatus for diagnosing battery replacement for vehicles is recorded, may execute a process provided by the method for diagnosing battery replacement.

The above-described method according to the present disclosure may be implemented as computer readable code in computer readable recording medium in which programs are recorded. Such computer readable recording media may include all kinds of recording media, in which data readable by computer systems is stored. As an example, the computer readable recording media may include a hard disk drive (HDD), a solid-state disk (SSD), a silicon disk drive (SDD), a ROM, a RAM, a CD-ROM, a magnetic tape, a floppy disk, and an optical data storage device, etc.

It should be apparent from the above description that in an apparatus and method for diagnosing battery replacement for vehicles according to at least one embodiment the present disclosure, whether a battery has been replaced may be accurately diagnosed. The state of a new battery may be accurately estimated based on a first internal resistance under low-frequency condition and a second internal resistance under a high-frequency condition. Thus, the apparatus and method for diagnosing battery replacement for vehicles are capable of increasing the lifespan of the battery and maximally using battery energy.

Further, in the apparatus and method according to the present disclosure, even if the former battery has been replaced with a new battery of a different type or a different capacity, it may be accurately diagnosed that the battery has been replaced, and the energy of the new battery may be maximally used due to initialization of battery deterioration state information.

Moreover, in the present disclosure, the state of the battery may be more accurately estimated using the internal resistance of the battery under the low-frequency condition and the internal resistance of the battery under the high-frequency condition.

It should be apparent to those having ordinary skill in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. An apparatus for diagnosing battery replacement for a vehicle, the apparatus comprising:
   a measurer configured to measure an internal resistance of a battery;
   a storage configured to store the measured internal resistance; and
   a controller configured to diagnose whether the battery has been replaced based on the internal resistance,
   wherein the controller controls the measurer to repeatedly measure a first internal resistance or a second internal resistance after starting the vehicle to store and update the first or second internal resistance in the storage,
   wherein the controller, when vehicle power is reset, controls the measurer to measure a current first internal resistance value or a current second internal resistance value, compares the current first internal resistance value with the stored first internal resistance value or compares the current second internal resistance value with the stored second internal resistance value, and diagnoses that the battery has been replaced when the corresponding values of the comparison differ from each other,
   wherein the first internal resistance is an internal resistance of the battery when a rotational speed of an engine of the vehicle is increased and the vehicle is in a stopped state, and
   wherein the second internal resistance is an internal resistance of the battery when the rotational speed of the engine of the vehicle is increased and the vehicle is in a driving state.

2. The apparatus according to claim 1, wherein the measurer measures different internal resistances of the battery depending on a frequency of power applied to the battery.

3. The apparatus according to claim 1, wherein the controller, prior to resetting the vehicle power, controls the measurer to measure the first internal resistance or the second internal resistance after starting the vehicle, and when the first or second internal resistance is measured, updates the measured first or second internal resistance and stores the updated first or second internal resistance in the storage.

4. The apparatus according to claim 3, wherein:
   the first internal resistance is an internal resistance of the battery when low-frequency power is applied to the battery; and
   the second internal resistance is an internal resistance of the battery when high-frequency power is applied to the battery.

5. The apparatus according to claim 1, wherein, in the comparison between the current first internal resistance value and the former first internal resistance value, the controller confirms whether the current first internal resistance value differs from the former first internal resistance value, and diagnoses that the battery has been replaced when the current first internal resistance value differs from the former first internal resistance value.

6. The apparatus according to claim 5, wherein, in the confirmation as to whether the current first internal resistance value differs from the former first internal resistance value, when the current first internal resistance value is the same as the former first internal resistance value, the controller confirms whether the comparison between the current second internal resistance value and the former second internal resistance value has been completed, and measures an internal resistance prior to resetting the vehicle power when the comparison between the current second internal resistance value and the former second internal resistance value has been completed.

7. The apparatus according to claim 6, wherein, in the confirmation as to whether the comparison between the current second internal resistance value and the former second internal resistance value has been completed, the controller measures the internal resistance after resetting the vehicle power when the comparison between the current second internal resistance value and the former second internal resistance value has not been completed.

8. The apparatus according to claim 1, wherein, in the comparison between the current second internal resistance value and the former second internal resistance value, the controller confirms whether the current second internal resistance value differs from the former second internal resistance value, and diagnoses that the battery has been replaced when the current second internal resistance value differs from the former second internal resistance value.

9. The apparatus according to claim 8, wherein, in the confirmation as to whether the current second internal resistance value differs from the former second internal resistance value, when the current second internal resistance value is the same as the former second internal resistance value, the controller confirms whether the comparison between the current first internal resistance value and the former first internal resistance value has been completed, and measures an internal resistance prior to resetting the vehicle power when the comparison between the current first internal resistance value and the former first internal resistance value has been completed.

10. The apparatus according to claim 9, wherein, in the confirmation as to whether the comparison between the current first internal resistance value and the former first internal resistance value has been completed, the controller measures the internal resistance after resetting the vehicle power when the comparison between the current first internal resistance value and the former first internal resistance value has not been completed.

11. A method for diagnosing battery replacement in an apparatus for diagnosing battery replacement for a vehicle, the method comprising:
  confirming, by a processor, whether or not the vehicle is started;
  measuring, by a processor, a first internal resistance or a second internal resistance after the vehicle is started to store and update the measured first or second internal resistance in a storage;
  confirming, by a processor, whether vehicle power is reset;
  confirming, by a processor, whether the vehicle is started when the vehicle power is reset;
  re-measuring, by a processor, a current first internal resistance or a current second internal resistance when the vehicle is started;
  re-updating, by a processor, the stored first or second internal resistance with the current first or second internal resistance;
  comparing, by a processor, the updated current first internal resistance value with the stored first internal resistance value or comparing the updated current second internal resistance value with the stored second internal resistance value; and
  diagnosing, by a processor, that a battery has been replaced, as a result of the comparison, when the corresponding values of the comparison differ from each other,
  wherein the first internal resistance is an internal resistance of the battery when a rotational speed of an engine of the vehicle is increased and the vehicle is in a stopped state, and
  wherein the second internal resistance is an internal resistance of the battery when the rotational speed of the engine of the vehicle is increased and the vehicle is in a driving state.

12. The method according to claim 11, wherein:
  the first internal resistance is an internal resistance of the battery when low-frequency power is applied to the battery; and
  the second internal resistance is an internal resistance of the battery when high-frequency power is applied to the battery.

13. The method according to claim 11, wherein, in the comparing the current first internal resistance value with the former first internal resistance value,
  as the result of the comparison, when the current first internal resistance value differs from the former first internal resistance value, it is diagnosed that the battery has been replaced; and
  as the result of the comparison, when the current first internal resistance value is the same as the former first internal resistance value, whether the comparison between the current second internal resistance value and the former second internal resistance value has been completed is confirmed, and an internal resistance is measured prior to resetting the vehicle power when the comparison between the current second internal resistance value and the former second internal resistance value has been completed.

14. The method according to claim 13, wherein, in the confirming whether the comparison between the current second internal resistance value and the former second internal resistance value has been completed, the internal resistance is measured after resetting the vehicle power when the comparison between the current second internal resistance value and the former second internal resistance value has not been completed.

15. The method according to claim 11, wherein, in the comparing the current second internal resistance value with the former second internal resistance value,
  as a result of the comparison, when the current second internal resistance value differs from the former second internal resistance value, it is diagnosed that the battery has been replaced; and
  as a result of the comparison, when the current second internal resistance value is the same as the former second internal resistance value, whether the comparison between the current first internal resistance value and the former first internal resistance value has been completed is confirmed, and an internal resistance is measured prior to resetting the vehicle power when the comparison between the current first internal resistance value and the former first internal resistance value has been completed.

16. The method according to claim 15, wherein, in the confirming whether the comparison between the current first internal resistance value and the former first internal resistance value has been completed, the internal resistance is measured after resetting the vehicle power when the comparison between the current first internal resistance value and the former first internal resistance value has not been completed.

17. A computer readable recording medium having recorded thereon a program to execute the method according to claim 12.

18. A vehicle comprising:
  a battery; and
  an apparatus for diagnosing battery replacement, the apparatus configured to diagnose whether the battery has been replaced based on an internal resistance of the battery,
  wherein the apparatus comprises:

a measurer configured to measure the internal resistance of the battery;
a storage configured to store the measured internal resistance; and
a controller configured to control the measurer to repeatedly measure a first internal resistance or a second internal resistance after starting the vehicle to store and update the first or second internal resistance in the storage,
wherein the controller, when vehicle power is reset, controls the measurer to measure a current first internal resistance value or a current second internal resistance value, compares the current first internal resistance value with the stored first internal resistance value or compares the current second internal resistance value with the stored second internal resistance value, and diagnoses that the battery has been replaced when the corresponding values of the comparison differ from each other,
wherein the first internal resistance is an internal resistance of the battery when a rotational speed of an engine of the vehicle is increased and the vehicle is in a stopped state, and
wherein the second internal resistance is an internal resistance of the battery when the rotational speed of the engine of the vehicle is increased and the vehicle is in a driving state.

\* \* \* \* \*